US012681065B2

(12) United States Patent
McBryde et al.

(10) Patent No.: US 12,681,065 B2
(45) Date of Patent: Jul. 14, 2026

(54) SYSTEM AND METHOD FOR ACTIVE ELECTRONICALLY SCANNED ARRAY TEST AND CALIBRATION

(71) Applicant: Rockwell Collins, Inc., Cedar Rapids, IA (US)

(72) Inventors: Connor McBryde, Cedar Rapids, IA (US); James West, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 197 days.

(21) Appl. No.: 18/816,583

(22) Filed: Aug. 27, 2024

(65) Prior Publication Data

US 2026/0063696 A1 Mar. 5, 2026

(51) Int. Cl.
G01R 29/08 (2006.01)
G01R 29/10 (2006.01)

(52) U.S. Cl.
CPC ..... G01R 29/0871 (2013.01); G01R 29/0892 (2013.01); G01R 29/105 (2013.01)

(58) Field of Classification Search
CPC ............ G01R 29/0871; G01R 29/0892; G01R 29/105
USPC ......................................................... 342/165
See application file for complete search history.

(56) References Cited

U.S. PATENT DOCUMENTS

| | | | |
|---|---|---|---|
| 8,988,280 B2 | 3/2015 | Mosca et al. | |
| 9,397,766 B2 | 7/2016 | Puzella et al. | |
| 10,505,275 B2 | 12/2019 | Lee | |
| 10,571,503 B2 | 2/2020 | Paulsen et al. | |
| 10,663,563 B2 | 5/2020 | Schuman | |
| 10,965,386 B1 | 3/2021 | Davies et al. | |
| 10,979,152 B1 | 4/2021 | West et al. | |
| 11,131,701 B1 * | 9/2021 | Mathis ............... | G01R 29/0821 |
| 11,579,179 B2 * | 2/2023 | Lin ..................... | H04B 17/0085 |
| 11,705,974 B2 | 7/2023 | West et al. | |
| 12,013,424 B2 * | 6/2024 | Grieger ............. | G01R 29/0892 |
| 2012/0306521 A1 * | 12/2012 | Nickel ............... | G01R 31/3025 |
| | | | 324/754.03 |
| 2019/0235003 A1 * | 8/2019 | Paulsen .................. | H01Q 3/267 |
| 2020/0116759 A1 * | 4/2020 | Mroczkowski .... | G01R 1/06766 |
| 2021/0376938 A1 * | 12/2021 | West ..................... | H04B 17/12 |

(Continued)

FOREIGN PATENT DOCUMENTS

WO 2024081041 A1 4/2024

*Primary Examiner* — Brady W Frazier

(74) *Attorney, Agent, or Firm* — Kinney & Lange, P.A.

(57) ABSTRACT

A test system is presented for validating and calibrating an active electronically scanned array (AESA) with multiple distinct transceiver elements and associated RF channels. The test system includes a static mount for the AESA, and a test probe fixedly located relative to the static mount. The system also includes a network analyzer connected to the AESA and the test probe, and a test processor connected to the network analyzer. The network analyzer provides RF evaluations of amplitudes and phases/time delays to the test processor, which estimates far field (FF) patterns of the AESA based on these inputs and assessments of free space path losses and propagation delays between the AESA and the test probe. The test processor calculates FF figures of merit (FoMs) for the AESA as a function of frequency, beam scan, and environmentals based on the estimated FF patterns, and validates the AESA based on these FF FoMs.

17 Claims, 4 Drawing Sheets

(56) References Cited

U.S. PATENT DOCUMENTS

2023/0006754 A1    1/2023   Bellemare et al.
2024/0145912 A1    5/2024   Brillant et al.

* cited by examiner

270

220
FATE
Probe
Antenna f(freq, $\theta$, $\varphi$)

240
Free Space
Path Loss &
Propagation Delay f(freq, $r_n$, $\tau_d$, $\theta$, $\varphi$)

100
AESA Radiative
RF Channel
"Active Element Patterns"

f(freq, $\theta$, $\varphi$)

PNA

230

SYSTEM AND METHOD FOR ACTIVE ELECTRONICALLY SCANNED ARRAY TEST AND CALIBRATION

BACKGROUND

The present disclosure relates generally to active electronically scanned array systems, and more particularly to systems and methods for testing, calibrating, and validating active electronically scanned array systems.

Phased or time-delay-based array radar systems such as electronically scanned array (ESA) radar systems are in widespread use in military applications, and are increasingly commonly used in commercial aerospace applications. Active ESA (AESA) radar systems can be used in meteorological data collection (e.g., to assemble and identify relevant weather information), collision avoidance (e.g., identifying locations types, and velocities of vehicles and other obstacles), and target or surface identification (e.g., device or threat recognition, geographic cataloguing and location identification). AESA radar offers extremely high resolution at relatively small antenna size by forming a beam of radio waves—or, in some cases, multiple beams (e.g. sum and difference beams) simultaneously—and minimizing composite error signal to locate targets.

Phase array systems in general, and AESA radar systems in particular, are highly sensitive to even small miscalibrations or faults (e.g., due to mechanical and/or electrical imperfections first apparent when activated), and therefore require meticulous production testing to validate and/or correct performance in expected use, e.g., to ensure functionality and consistent accuracy in with regard to far field (FF) figures of merit (FoMs). Slight imperfections in AESA calibration (which are essentially inevitable in real-world applications) can be consequential or inconsequential, and each system must be exhaustively tested and calibrated during or immediately following production to ensure functionality.

SUMMARY

This disclosure presents a test system for validating and calibrating an active electronically scanned array (AESA) with multiple distinct transceiver elements and associated RF channels. The test system includes a static mount for the AESA, and a test probe fixedly located relative to the static mount. The system also includes a network analyzer connected to the AESA and the test probe, and a test processor connected to the network analyzer. The network analyzer provides RF evaluations of amplitudes and phases/time delays to the test processor, which estimates far field (FF) patterns of the AESA based on these inputs and assessments of free space path losses and propagation delays between the AESA and the test probe. The test processor calculates FF figures of merit (FoMs) for the AESA as a function of frequency, beam scan, and environmentals based on the estimated FF patterns, and validates the AESA based on these FF FoMs.

This disclosure additionally presents a method of testing an AESA. According to this method, the AESA and at least one test probe are mounted in a fixed geometric relationship and surrounded by an anechoic enclosure. Amplitudes and phases and/or time delays of the test probe and the AESA are collected using an RF precision network analyzer (PNA), and free space path losses and propagation delays between the AESA and the test probe are computed based on the fixed geometric relationship. FF patterns and associated FoMs are then generated based on post-processing of the collected RF amplitudes and phases and/or time delays, and based on the predicted free space path losses and propagation delays.

The present summary is provided only by way of example, and not limitation. Other aspects of the present disclosure will be appreciated in view of the entirety of the present disclosure, including the entire text, claims, and accompanying figures.

Figure 1:
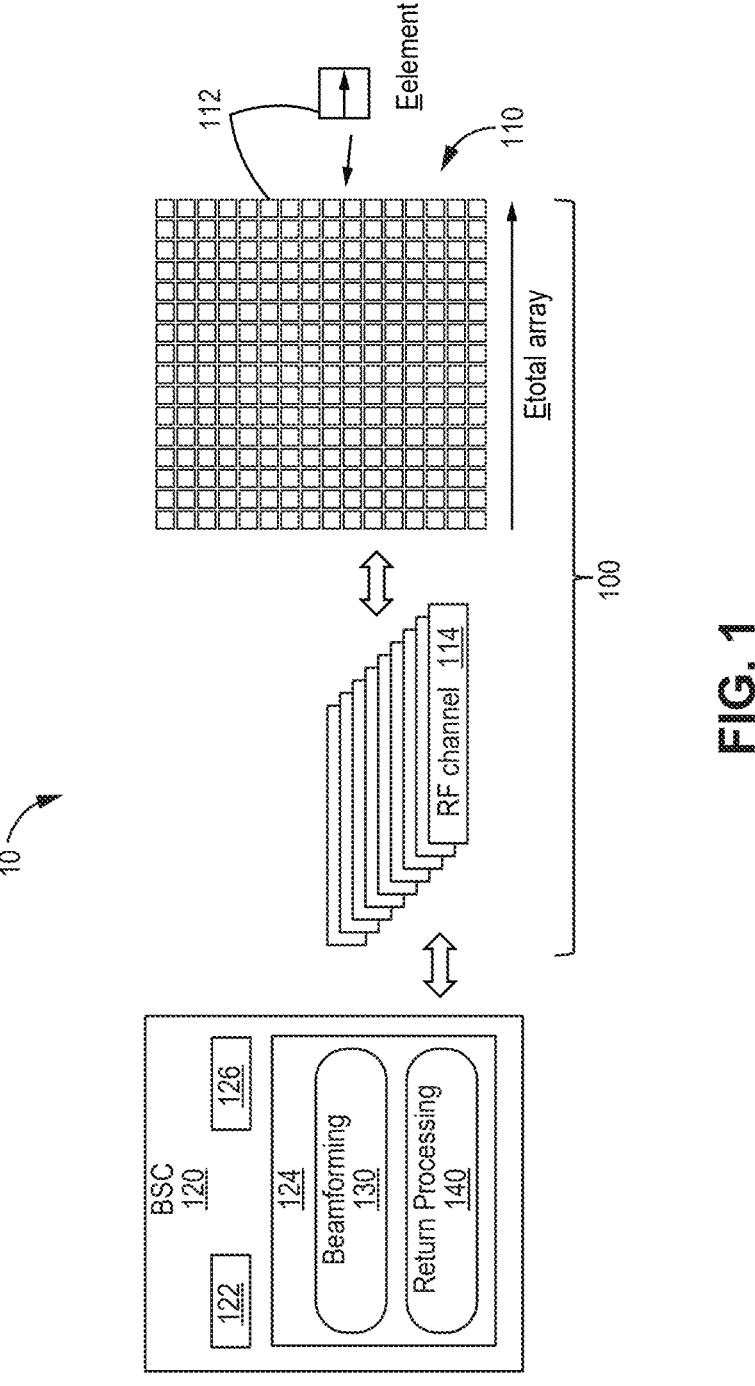
FIG. 1 is a simplified schematic view of an illustrative AESA radar system.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

This disclosure presents a testing, calibration, and validation methodology for AESA radar using Fast Array Test Environment (FATE) analysis without direct reliance on far field (FF) or near field (NF) metrology.

FF antenna metrology requires extremely large, electrically RF quiet (anechoic), testing enclosures (dimensions on the order of at least ~100 ft.) to evaluate AESA FoMs to required accuracies. Data acquisition with such direct FF testing is commensurately slow due to time required to mechanically rotate AESA hardware with massive payloads about axes of rotation offset from device centers of mass. Testing according to these methods can take multiple days, and escalating array/system complexity can increase this test time further.

Traditional Near Field Range (NFR) antenna metrology extrapolates to FF FoMs by deconvolving NF data (e.g., Nyquist sampling of a closed NF surface) via Schelkunoff surface field equivalence. FoMs can, for example, include effective isotopically radiated power (EIRP), bandwidth, field of view (FoV), and quotient of received gain to antenna noise temperature. More generally pertinent FF FoMs relevant to the approaches set forth herein include those defined in (1) IEEE Std 145-1993 (Revision of IEEE Std 145-1983) IEEE Standard Definitions of Terms for Antennas; and (2) IEEE Std 149-1979 (R2008) (Revision of IEEE Std 149-1965) IEEE Standard Test Procedures for Antennas.

NF data is "probe corrected" to remove the radiation pattern filtering function of the NFR probe itself, the AESA FF is calculated using discrete Fourier transforms (DFT), and complex aperture excitation is calculating using inverse discrete Fourier transforms (IDFT). NFR metrology requires scanning (i.e., mechanically) across a wide surface. Though faster and less mechanically volumetric than FF metrology, capturing multiple beam positions (e.g., for multiple AESA beams) using NFR antenna metrology still entails considerable mechanical testing time and complexity.

This disclosure presents an alternative approach to AESA testing and calibration using Fast Array Test Environment (FATE) processes, eschewing direct FF or NF metrology. This approach tests aperture excitations and phases and/or time delays for all array elements and generates FF estimates directly based on these sensed aperture readings. FF FoMs can thereby be determined through analysis of resulting FF estimates, without any need to mechanically rotate or actuate any element of the AESA system. Because this FATE-based approach only requires traversal of electronic parameter spaces, not mechanical movement, it can be performed at extremely high speed, and with low space requirements.

FIG. 1 is a simplified schematic view of radar system 10, an illustrative AESA radar system including AESA 100 and beam steering controller (BSC) 120. AESA 100 can, for example, be a half-duplexed Tx and Rx AESA with aperture 110 comprising multiple discrete emitter/receiver elements 112 each having a corresponding dedicated radio frequency (RF) channel 114. Each RF channel 114 can, for example, include a beamforming RF integrated circuit (BFIC) and transmit/receive module (TRM). RF channels 114 are collectively governed and coherently aggregated by hardware, firmware, and software within BSC 120 (described below).

BSC 120 is a hardware device with software and/or firmware that collectively control BFICs of each RF channel 114, thereby operating AESA 100. As illustrated in FIG. 1, BSC 120 includes processor 122, memory 124, and interface 126.

AESA 100 is a phased array, e.g. installed on a common antenna, of multiple discrete RF channels 114 with associated antenna elements 112. As principally described herein, AESA 100 can be used for radar applications. More generally, however, AESA 100 can additionally or alternatively be used for transmission and reception of radiation for other purposes, such as targeted or localized communication. Each antenna element 112 and associated RF channel 114 can, in some embodiments, act as both an emitter (i.e., generating components of beams of AESA 100 in cooperation with other RF channels 114 as a phased array) and a receiver (i.e., receiving radar returns for processing by BSC 120). Active antenna elements 112 collectively define aperture 110 of AESA 100, and are each capable of radiating an independent signal from respective RF channel 114. RF channels 114 can at least include a dedicated BFIC and TRM governed by beamforming module 130 (see below). RF channels 114 can have a serial peripheral interface (SPI) or non-serial bus. More generally, however, any appropriate signal channel can be used, so long as each RF channel 114 making up AESA 100 is capable of independent adjustment by and reporting to BSC 120. As illustrated in FIG. 1, each antenna element 112 shares a common horizontal electric field polarization E with AESA 100, as a whole. More generally, however, other electric field polarizations can be shared by all elements 112 and by AESA 112 as a whole, including vertical or other-angled linear polarizations and/or circular polarizations.

In the illustrated embodiment, AESA 100 consists of a multitude of independently controllable RF channels 114 with associated antenna elements 112 distributed in a rectangular arranged on orthogonal axes. More generally, however, physical locations of antenna elements 112 need not always be physically arranged along axes forming independent bases, and alternative array geometries can be simulated at beamforming, notwithstanding physical locations of each antenna element 112. Furthermore, although AESA 100 is depicted as a dense array of antenna elements 112, sparser arrangements of active emitters (i.e., antenna elements 112) can also be used, so long as array gaps to not introduce significant unwanted signal periodicity. Although this disclosure focuses for ease of explanation on systems and methods involving planar arrays, it should be understood that these approaches can be applied more generally to nonplanar geometries such as convex, concave, cylindrical, and/or conformal arrays.

As introduced above, BSC includes processor 122, memory 124, and interface 126. Processor 122 is a logic-capable device that can execute software, applications, and/or programs stored on memory 124. Examples of processor 122 can include one or more of a processor, a microprocessor, a controller, a digital signal processor (DSP), an application specific integrated circuit (ASIC), a field-programmable gate array (FPGA), or other equivalent discrete or integrated logic circuitry. Processor 122 can be entirely or partially mounted on one or more circuit boards.

Memory 124 is configured to store information and, in some examples, can be described as a computer-readable storage medium. Memory 124, in some examples, is described as computer-readable storage media. In some examples, a computer-readable storage medium can include a non-transitory medium. The term "non-transitory" can indicate that the storage medium is not embodied in a carrier wave or a propagated signal. In certain examples, a non-transitory storage medium can store data that can, over time, change (e.g., in RAM or cache). In some examples, memory 124 is a temporary memory. As used herein, a temporary memory refers to a memory having a primary purpose that is not long-term storage. Memory 124, in some examples, is described as volatile memory. As used herein, a volatile memory refers to a memory that that the memory does not maintain stored contents when power to the memory 124 is turned off. Examples of volatile memories can include random access memories (RAM), dynamic random-access memories (DRAM), static random-access memories (SRAM), and other forms of volatile memories. In some examples, the memory is used to store program instructions for execution by the processor. The memory, in one example, is used by software or applications running on BSC 120 to temporarily store information during program execution. Memory 124 can, in some embodiments, store calibrations for specific AESA configurations, including RF channel phases, time delays, and amplitudes, as described in detail below.

Interface 126 is an input and/or output device, set of devices, and/or software interface, and enables BSC 120 to communicate with other components of radar system 10. In addition, interface 126 can provide means of digital or analog signal communication between radar system 10 and other devices (see FIG. 2), and/or connection to a human interface operable by a human user such as an operator or technician. In some embodiments, interface 126 can be a machine-to-machine interface such as a transceiver or adapter whereby a user interacting with a remote device can indirectly interface with BSC 120.

Memory 124 is illustrated as hosting functional software modules 130 and 140. These modules are collectively responsible for controlling radiation emission and reception, and processing return signals as known in the art, and are executed by BSC 120 using processor 122. More specifically, beamforming module 130 is responsible for specifying amplitude and phase or time delay of radiation emission from all RF channels 114 as a phased array to produce multiple beams, while return processing module 140 is responsible for amplitude- or phase/time delay-based comparison of return signals, general noise reduction, and in some embodiments, imaging based on radar returns. In general, although discussion herein focuses illustratively on processing based at least in part on RF channel amplitude and phase, the approaches set forth herein are equivalently applicable to amplitude and time delay-based beamforming and return processing, and can be more generally described as approaches applicable to a time-based parameter (e.g., time delay or phase).

In the illustrative embodiments principally described herein, BSC 120 operates beamforming module 130 to define at least one beam in Tx and Rx operation. In some examples, Tx operation can involve the generation of a single a sum beam $\Sigma$, while Rx operation can involve a single beam or multiple beams (e.g., beams $\Sigma$, $\Delta_{az}$, and $\Delta_{el}$. Sum beam $\Sigma$ can, for example, be defined by a Taylor-weighted beam profile to reduce sidelobe amplitude, while difference beams $\Delta_{az}$ and $\Delta_{el}$ can, for example, be defined by Bayliss-weighted beam profiles, Taylor-weighted beam profiles, and/or split Taylor-weighted beam profiles. Although this disclosure principally describes Tx operation involving only a sum beam, the FATE-based testing and calibration approaches set forth herein can also be applied to systems configured to produce multiple beams during Tx and/or Rx operation. In some embodiments, AESA calibration of multiple beams (e.g., beams $\Sigma$, $\Delta_{az}$, and $\Delta_{el}$) can be co-optimized, for example to produce spatially coincident nulls or achieve desired sidelobe FoMs.

Figure 2A:
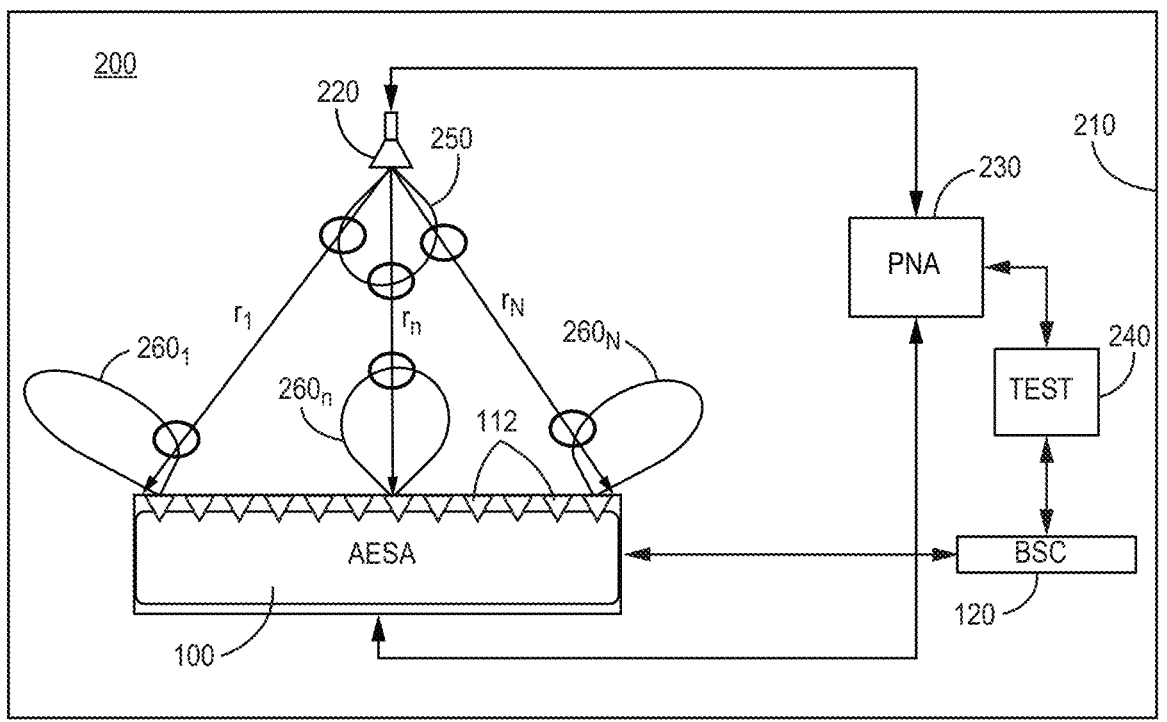
FIG. 2a is a simplified schematic diagram of a test suite for the AESA radar system of FIG. 1.
Figure 2B:
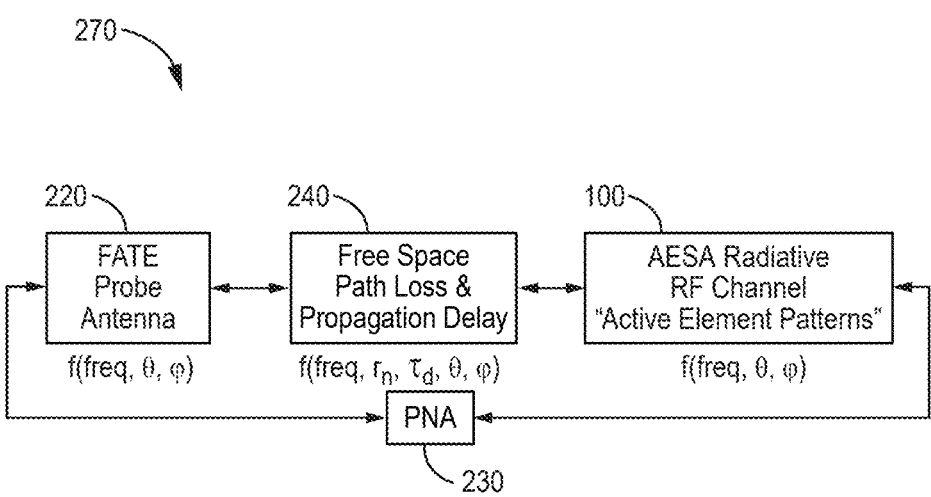
FIG. 2b is a functional block diagram illustrating a transfer function characterizing operation of the test suite of FIG. 2a FIG. 3 is a method flowchart illustrating a testing process for the radar system of FIG. 1, using the test suite of FIG. 2a and transfer function of FIG. 2b.

FIG. 2a provides a simplified schematic diagram of test suite 200, a production test environment configured to test, troubleshoot, and (re)calibrate AESA 100. FIG. 2b provides a functional block diagram of transfer function 270, a Friis spatial transfer function characterizing operation of test suite 200. As explained in further detail with reference to FIG. 3, test suite 200 facilitates calibration of AESA 100 and evaluation of FF radiative FoMs as a function of frequency, beam scan, and environmentals (e.g., temperature, humidity, pressure) without conventional (and comparatively slow) NF or FF metrology.

AESA 100 (including multiple antenna elements 112) operates generally as discussed above with reference to FIG. 1, and is housed during testing within a test environment enclosed and isolated by enclosure 210. BSC 120 is connected to AESA 110 and functions as noted above. In addition to AESA 100 and BSC 120, test suite 200 includes enclosure 210, FATE probe 220, precision network analyzer (PNA) 230, and test processor 240. FIG. 2a also illustrates probe radiation pattern 250 and AESA illustrative selected active element patterns 260₁/260ₙ/260ₙ. Example vectors $r_1/r_n/r_N$ representing propagation delay between probe 220 and respective individual elements 112 of AESA 100 are shown corresponding to active element patterns 260₁/260ₙ/260ₙ. Although only one FATE probe 220 is depicted, some embodiments of test suite 200 can include multiple test probes to improve signal to noise ratio (SNR) and phase measurement stability as influenced by overall probe complex amplitude and phase/time delay patterns, and/or to accommodate more complex geometries of AESA 100 (cylindrical, conformal, etc.). Overall, all test probes 220 are selected and positioned within receptacle 210 of test suite 200 for optimal illumination and reception based on geometry of AESA 100.

Enclosure 210 can be any sort of isolating structure defining a electromagnetic non- or minimally-reflective boundary of test suite 200. In some embodiments, enclosure 210 can include a static platform or other structure to fixedly mount AESA 100. More generally, test suite can use any suitable means to fixedly secure AESA 100 within enclosure 210, at a static position relative to FATE probe(s) 220. Advantageously, because AESA 100 need not be translated or rotated within enclosure 210, test suite 200 can be comparatively small relative to functionally similar NFR test apparatus. Most generally, however, enclosure 210 illustrates a defined perimeter of isolation (e.g., from electromagenetic noise) for test suite 200, such that test measurements are purely dependent upon activity of AESA 100 and FATE probe 220, with minimal incidental backscatter from enclosure 210. To facilitate calibration of AESA 100 over environmentals, enclosure 210 can include tools capable of controlling and sensing environmental conditions such as temperature, pressure, and humidity within enclosure 210 as known in the art.

FATE probe 220 is an antenna configured to emit and/or receive a complex radiation pattern for evaluation of AESA 100, and to detect radiation signals from AESA 100. PNA 230 is a precision vector network analyzer communicatively coupled to be AESA 100 and FATE probe 220, and capable of radiofrequency (RF) switching for substantially simultaneous complex excitation of AESA 100 and probe 220, e.g., to excite test probe 220 and receive signals from AESA 100, and vice versa. Although PNA 230 is described as a single network analyzer, functions of PNA 230 can be distributed across or divided between multiple devices in some embodiments. Moreover, PNA 230 can more generally be replaced with any coherently connected analyzer configured to very rapidly measure 2-port Tx and Rx parameters (e.g., S-Parameters, $S_{11}$, $S_{12}$, $S_{21}$, $S_{22}$) including amplitude and phase and/or time delay. Test processor 240 is a logic-capable device such as a processor, microprocessor, controller DSP, or ASIC configured to receive and evaluate outputs of PNA 230, and to direct BSC 120 based on those evaluations during testing and calibration of AESA 100. More specifically, test processor 240 operates PNA 230 and BSC 120 to exhaustively characterize and calibrate AESA 100 by testing and weighting of control parameters of each corresponding RF channel 114.

FATE probe 220 is situated at a fixed, known location and orientation relative to AESA 100, and emits probe radiation pattern 250 with phase and amplitude characterized as a function of frequency, polarization and angle (i.e., f(f, $\theta$, $\phi$), where f is frequency, $\theta$ is elevation angle, and $\phi$ is azimuth angle). Probe radiation pattern 250 can, for example, be defined by a parasitic filter function (i.e., with amplitude and phase transfer functions that are not omnidirectional) deconvolved to the aforementioned f(f, $\theta$, $\phi$) characterization at AESA 100 based on known geometry of test suite 200. As shown in FIG. 2a, locations of example individual elements 112 with associated radiation patterns 260₁, 260ₙ and 260ₙ are defined relative to FATE probe 220 and its radiation pattern 250 by vectors $r_1$, $r_n$, and $r_N$, respectively.

FATE 100 is tested in test suite 200 by measurement of all combinations of amplitude and time-dependence (phase and/or time delay) for every RF channel 114 of elements 112. These amplitudes and phases and/or time delays are evaluated by traversing all possible combinations of active RF channels 114, for example by switching on or off specific channels or by Hadamard (i.e. orthonormal) matrix coding provided by test processor 240 and reflected in individual element control by BSC 120. Test processor 240 additionally predicts and compensates for free space path loss and propagation delay between FATE probe 220 and each element 112 are based on radiation patterns (250, 260) and known corresponding vectors $r_x$ according to a Friis spatial transfer function, as noted in FIG. 2b. As explained below, the approaches to testing and calibration enabled by test suite 200 (including both Hadamard and non-Hadamard methodologies) are orders of magnitude faster than conventional NF and FF metrology approaches reliant on electromechanical motion.

Received signal for each antenna element 112 of AESA 110 corresponding to probe radiation pattern 250 depends on several factors, including: (1) line-of-sight propagation delay between a phase center of FATE probe 220 and that specific element 112; (2) complex radiation pattern 250 as a function of frequency and physical location of the specific element 112; and (3) active element radiation patterns (e.g., patterns 260) for every element of AESA as a function of frequency and location relative to each other element of AESA 100. These effects compensate for all combinations of amplitude and time dependence (phase or time delay) settings, which are applied as corrections for AESA 100 as noted below with reference to FIG. 3. More specifically, once amplitude and time dependence states of AESA 100 are known/calibrated, assessed active element complex radiation patterns are used to predict FF radiation performance through conventional array factor mathematics to calculate $4\pi$ steradian performance of AESA as a function of frequency, scan, and environmentals. Thus, test suite 200 (and method 300, described below) enables all phase states of AESA 100 to be mapped and either stored in memory 122 of BSC 120 or corrected analytically, thereby allowing FF FoMs to be derived via post-processing based on testing within test suite 200.

Test suite 200 allows extremely rapid calibration of AESA 100 by exploring all permutations of RF channels 214 of AESA 100, then extrapolating from element analyses to analytically predict corresponding FF radiation patterns. The space of possible RF channels 214 can, in some embodiments, be traversed by exploiting Hadamard orthonormal and derivative linear algebra algorithms to incoherently drive AESA 100 through all amplitude and time-dependence states for each RF channels 114. Because the evaluation of AESA performance through this entire parameter space only requires control and sensing/evaluation of antenna gain and phase/time delay on fixed hardware (i.e., AESA 100 and FATE probe 220), characterization of each RF channel 214 is limited only by equipment bus speeds of FATE 100, BFC 120, FATE probe 220, and test processor 240; no parts need move. This contrasts with conventional NF and FF metrology-based methods, which require comparatively slow (e.g., by multiple orders of magnitude) electromechanical movement arrays relative to probes. The incoherent driving of AESA 100 allows characterizations of individual channels 114 through analysis of aggregate performance of AESA 100 by facilitating disentanglement of signals of orthogonally driven sets of channels 114. Once each channel 214 has been fully characterized, additional phase and amplitude error correction techniques can be deployed to minimize amplitude and phase errors on a per-channel basis.

Once amplitude and time-dependence characterizations of all RF channels 214 of AESA 100 are known across all adjustment ranges of each channel, traditional FF FoMs can be calculated by conventional array mathematics with precision and resolution limited only by RF active Least Significant Bit (LSB) and RMS errors for each amplitude and phase state of elements 214. These FF FoM projections can, for example, be generated by test processor 240. By obviating the need for mechanical movement and sampling at disparate locations, suite 200 reduces factory-level testing times for AESA 100 dramatically (e.g., by several orders of magnitude) relative to conventional NF metrology. Moreover, FF characterizations of AESA 100 are generated as extrapolations of comprehensive evaluations of individual elements 112, the minimum scale of test suite 200 is determined by measurement length scale for FF characteristics of a single radiating element, allowing test suite to be extremely compact. In an illustrative example, an embodiment of test suite 200 for testing a 36×36 inch 10 GHz (X band) AESA 100 at an AFF range length of 216 feet could be fully enclosed by a 48×48×48 inch enclosure 210 (including anechoic absorbing foam). By contrast, a test system for validation and calibration to the same specifications using convention NF metrology would typically require at least a 96×96 inch high precision planar scanner and a larger foamed room. In short, enclosure 210 can be a relatively small volume anechoic container, e.g., smaller than an analogously NF system by a factor of four or more, and smaller than an analogous conventional FF system by a factor of 100 or more. This compactness allows simpler and more reliable control of environmental parameters such as temperature, humidity, altitude, shocks, and vibrations—even when testing AESA systems with large effective apertures—and consequently allows AESA 100 to be tested with respect to environmentals within test suite 200. Enclosure 210 can, for example, have width and height less than double corresponding dimensions of AESA 100.

Figure 3:
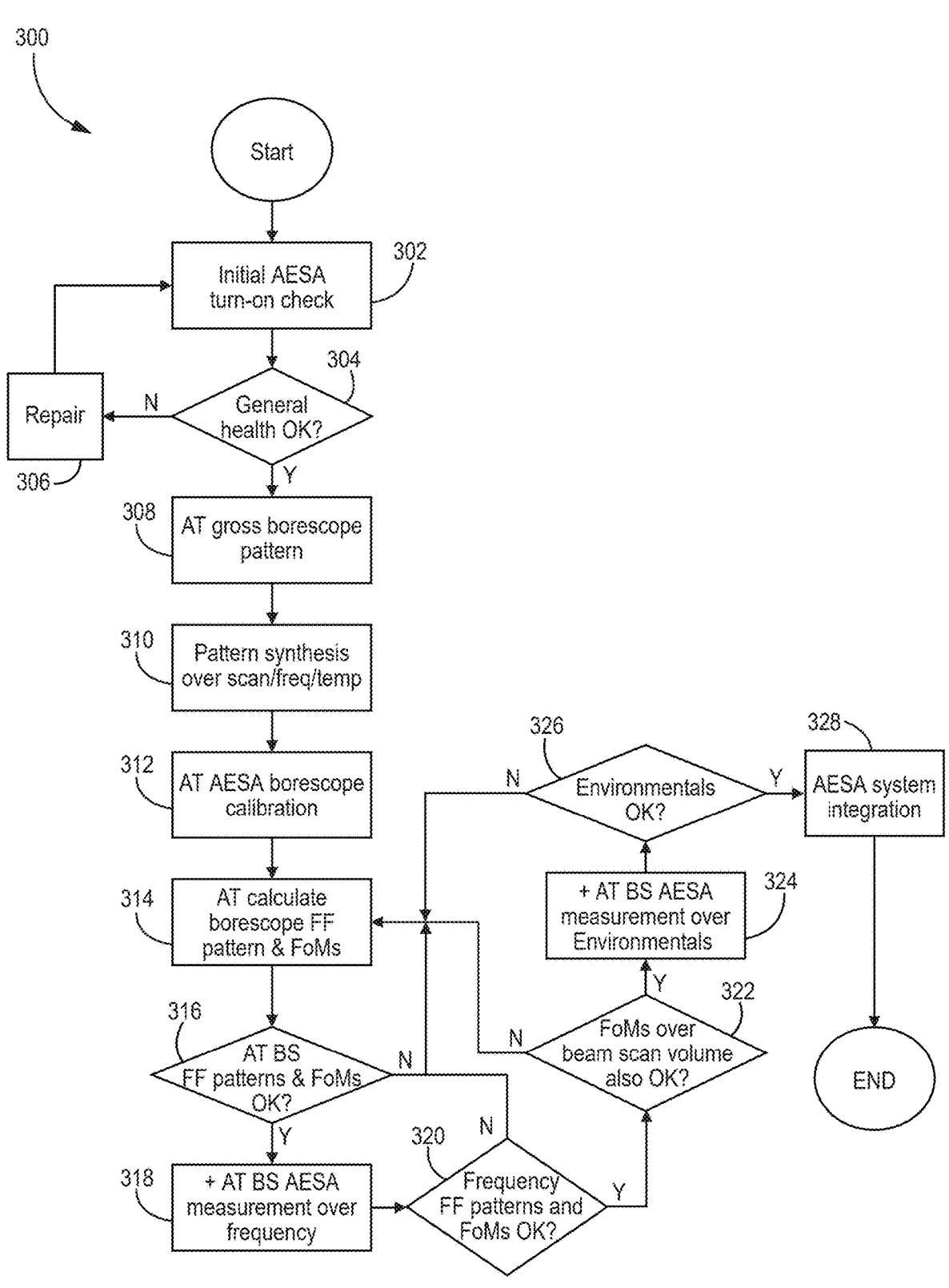

FIG. 3 illustrates method 300, a test and calibration method for AESA 100 for use with test suite 200. Method 300 is an iterative method of validating FF performance of AESA 100 across successive cumulative sets of requirements by array-based extrapolation from RF channel-level mapping to array-level FF predictions as described with reference to FIGS. 2a and 2b.

Upon initialization of AESA 100 in test suite 200, preliminary checks are performed to validate basic general health of the system. (Step 302). These tests can, for example, include evaluations of whether temperatures and DC biases are within normal operating ranges (i.e., no overheats, shorts, or other major fundamental faults). Results of these tests are evaluated by test processor 240 (Step 304), and AESA 100 is sent back to production for basic repair (e.g., fixing electrical faults) if general health of AESA 100 is unacceptable (Step 306).

Assuming that steps 302-304 indicate that AESA 100 is operable, an ambient environment test (AT) gross borescope pattern is generated for a baseline frequency by setting all amplitudes and phases/time delays of AESA 100 equal across all RF channels 114 as a further basic check that the pre-calibrated AESA (see FIG. 2a) appears essentially healthy. (Step 308).

Next, AESA FF patterns are synthesized to arrive at desired FF patterns for testing of commensurate FF FoMs (Step 310). Ambient environment tests can, for example, be ambient lab or production floor tests. Pattern synthesis can, in some embodiments, include null optimization to localize one or more spatial nulls in beam patterns of AESA 100. Calibration of AESA 100 is performed at a per-element basis for each RF channel 114. Although not tested in immediately subsequent steps, evaluations over frequency and beam scan are preferably generated at step 310, though in alternative embodiments these evaluations can instead be generated as-needed before corresponding evaluations. Desired FF patterns are identified via inverse Fourier transform as 1-to-1 mappings to amplitudes and phases/time delays of all RF channels 114 of AESA 100, with actual hardware amplitude and phase/time delay defining (i.e., identical to) amplitudes and phases/time delays in the aperture plane of AESA 100.

FATE calibration is next performed for AESA borescope calibration, using AT borescope amplitudes and phases/time delays acquired for element 112 at step 210 as initial calibration values, to match hardware. (Step 312). Test processor 240 then post-processes borescope FTE aperture plane amplitude and phases/time delays for all radiating elements to generate FF patterns and FoMs for AT borescope values by extrapolation, as introduced above. (Step 314). If AT borescope values for FF patterns and FoMs fall within acceptable ranges (Step 316), test processor 240 generates extrapolations to AT borescope AESA calibrations and characterizations over frequency. (Step 318). If FF frequency patterns and corresponding FoMs are acceptable (Step 320), FF FoMs are then estimated and evaluated over beam scan volume (cumulatively with frequency) (Step 322). If these FoMs also fall within acceptable ranges, FF FoMs are additionally estimated over environmentals (cumulatively with frequency and beam scan volume). (Step 324). If FoMs reflecting projected FF values over environmentals also fall within acceptable ranges (Step 326), calibration is deemed acceptable. If FoMs depart from acceptable ranges at any test in steps 316, 320, 322, or 326, test processor 240 returns to step 314 to update calibrations with respect to parameters newly evaluated in that test (i.e., borescope pattern, frequency pattern, beam scan volume, and environmentals, respectively). Updating calibrations can, for example, comprises updating element-level gains and/or phases of individual RF channels 112. Once all FoMs evaluated in these steps have been estimated and evaluated, and fall within acceptable ranges, calibration values are integrated into AESA system 100 by persistently storing resulting calibration values for all RF channels 214 (Step 328), and method 300 ends.

The approach set forth with respect to FIGS. 2a, 2b, and 3 allows FATE algorithms to be used in place of IEEE standard antenna metrology for equivalent testing and validation over frequency, beam scan, and temperature, but at greatly increased speed and lower cost. Moreover, the approaches and systems set forth herein are achievable within small volume anechoic chambers, further simplifying and reducing cost of AESA calibration and validation While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

DISCUSSION OF POSSIBLE EMBODIMENTS

The following are non-exclusive descriptions of possible embodiments of the present invention.

A test system for validating and calibrating an active electronically scanned array (AESA) having a plurality of distinct transceiver elements with associated RF channels, the test system comprising: a static mount configured to fixedly receive the AESA; at least one test probe fixedly located relative to the static mount and configured to transmit and receive complex radiation patterns to and from the AESA; a network analyzer communicatively coupled to the AESA and the at least one test probe, and configured for RF evaluation of amplitudes and phases and/or time delays of the test probe and the AESA; and a test processor communicatively connected to the network analyzer, and configured to: predict free space path losses and propagation delays between the AESA and the at least one test probe based radiation patterns of each and corresponding vectors defining known relative position of the at least one test probe and each of the plurality of distinct transceiver elements; estimate far field (FF) patterns of the AESA based on postprocessing of the amplitudes and phases and/or time delays received via the network analyzer, compensating for the predicted free space path losses and propagation delays; calculate FF figures of merit (FoMs) for the AESA as a function of frequency, beam scan, and environmentals, based on the estimated FF patterns of the AESA; and validate the AESA based on the FF FoMs.

The test system of the preceding paragraph can optionally include, additionally and/or alternatively, any one or more of the following features, configurations and/or additional components:

A further embodiment of the foregoing test system, further comprising an anechoic enclosure surrounding the static mount and the at least one test probe.

A further embodiment of the foregoing test system, wherein the anechoic enclosure has width and height less than double corresponding dimensions of the AESA.

A further embodiment of the foregoing test system, wherein the test processor predicts the free space path losses and propagation delays via a Friis spatial transfer function. A further embodiment of the foregoing test system, further comprising a beam steering controller (BSC) electronically connected to the AESA and operable to control beamforming integrated circuits of each of the associated RF channels.

A further embodiment of the foregoing test system, wherein: the test processor is configured to command the BSC to traverse of all permutations of the RF channels by incoherently driving the AESA through all amplitude and time-dependence states for each RF channels; and estimating FF patterns of the AESA comprises analytically extrapolating from individual element analyses received from the network analyzer to the FF pattern using Hadamard orthonormal transformations and/or functionally analogous non-Hadamard schemes (e.g., via element switching).

A further embodiment of the foregoing test system, wherein the network analyzer is a precision vector network analyzer configured for RF evaluation of coherently connected two-port transmit and receive parameters including the amplitudes and the phases and/or time delays.

A further embodiment of the foregoing test system, wherein the test processor is configured to iteratively repeat the estimation of FF patterns and the calculation of FF FoMs, and to adjust calibrations of the AESA between these iterations in response to the FF FoMs falling outside of accepted ranges, such that the validation occurs once any adjustments to the calibrations produce FF FoMs within the accepted ranges.

A further embodiment of the foregoing test system, wherein the calculation of FF FoMs comprises: estimating first FoMs characterizing borescope FF performance of the AESA; evaluating whether the first FoMs fall within first acceptable ranges; and in response to the first FoMs falling within acceptable ranges, evaluating second FoMs characterizing the AESA over frequency and scan volume.

A further embodiment of the foregoing test system, wherein the calculation of FF FoMs further comprises: evaluating whether the second FoMs fall within second acceptable ranges; and in response to the second FoMs falling within acceptable ranges, evaluating third FoMs characterizing the AESA over environmentals including humidity, pressure, and temperature; and evaluating whether the third FoMs fall within third acceptable ranges.

A further embodiment of the foregoing test system, wherein the test processor is configured to adjust element-level gains and/or phases of the RF channels in response to the first, second, or third FoMs falling outside of respective first, second, and third acceptable ranges.

A further embodiment of the foregoing test system, wherein the FF FoMs comprise EIRP and bandwidth.

A further embodiment of the foregoing test system, wherein the at least one test probe comprises a plurality of test probes.

A further embodiment of the foregoing test system, further comprising an anechoic isolating enclosure surrounding the static mount and the at least one test probe.

A further embodiment of the foregoing test system, wherein the anechoic isolating enclosure includes tools configured to control and sense multiple environmental parameters from among temperature, pressure, and humidity, within the anechoic isolating enclosure.

A further embodiment of the foregoing test system, wherein the anechoic isolating enclosure has a width and a height less than double corresponding dimensions of the AESA.

A method of testing an AESA, the method comprising: mounting the AESA and a test probe in a fixed geometric relationship, the AESA comprising a plurality of individual antenna elements with respective radiofrequency (RF) channels; surrounding the AESA and the test probe in an anechoic enclosure; collecting RF amplitudes and phases and/or time delays of the test probe and the AESA using a precision network analyzer (PNA); predicting free space path losses and propagation delays between the AESA and the test probe based on the fixed geometric relationship; estimating far field (FF) patterns of the AESA based on post-processing of the collected RF amplitudes and phases and/or time delays, and based on the predicted free space path losses and propagation delays; calculating FF figures of merit (FoMs) for the AESA over frequency, beam scan, and environmentals based on the estimated FF patterns of the AESA.

The method of the preceding paragraph can optionally include, additionally and/or alternatively, any one or more of the following features, configurations and/or additional components:

A further embodiment of the foregoing method, further comprising evaluating the FF FoMs against acceptable ranges, and recalibrating the RF channels of the individual antenna elements of the AESA in response to the FF FoMs falling outside of the acceptable ranges.

A further embodiment of the foregoing method, wherein evaluating the FF FoMs comprises successively testing FF FoMs over frequency, then over frequency and beam scan, then over frequency, beam scan, and environmentals.

A further embodiment of the foregoing method, further comprising controlling at least one of humidity, temperature, and pressure within the enclosure, wherein calculating FF FoMs over environmentals comprises evaluating AESA performance at environmental conditions within the enclosure at selected values of humidity, temperature, and/or pressure.

A further embodiment of the foregoing method, wherein estimating FF patterns of the AESA comprises extrapolating from disentangled characterizations of the individual RF elements to an overall FF pattern based on orthonormal transformations.

SUMMATION

Any relative terms or terms of degree used herein, such as "substantially", "essentially", "generally", "approximately" and the like, should be interpreted in accordance with and subject to any applicable definitions or limits expressly stated herein. In all instances, any relative terms or terms of degree used herein should be interpreted to broadly encompass any relevant disclosed embodiments as well as such ranges or variations as would be understood by a person of ordinary skill in the art in view of the entirety of the present disclosure, such as to encompass ordinary manufacturing tolerance variations, incidental alignment variations, alignment or shape variations induced by thermal, rotational or vibrational operational conditions, and the like.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A test system for validating and calibrating an active electronically scanned array (AESA) having a plurality of distinct transceiver elements with associated RF channels, the test system comprising:

a static mount configured to fixedly receive the AESA;

at least one test probe fixedly located relative to the static mount and configured to transmit and receive complex radiation patterns to and from the AESA;

an RF measurement device communicatively coupled to the AESA and the at least one test probe, and configured to transmit and receive complex RF amplitudes and phases and/or time delays of the test probe and the AESA; and a test processor communicatively connected to the RF measurement device, and configured to:

predict free space path losses and propagation delays between the AESA and the at the at least one probe based on radiation patterns of each and corresponding vectors defining known relative positions of the at least one test probe and each of the plurality of distinct transceiver elements;

estimate far field (FF) patterns of the AESA based on post-processing of the amplitudes and phases and/or time delays received via the RF measurement device, compensating for the predicted free space path losses and propagation delays;

calculate FF figures of merit (FoMs) for the AESA as a function of frequency, beam scan, and environmentals, based on the estimated FF patterns of the AESA; and validate the AESA based on the FF FoMs.

2. The test system of claim 1, further comprising an anechoic enclosure surrounding the static mount and the at least one test probe.

3. The test system of claim 2, wherein the anechoic enclosure has width and height less than double corresponding dimensions of the AESA.

4. The test system of claim 1, wherein the test processor predicts the free space path losses and propagation delays via a Friis spatial transfer function.

5. The test system of claim 1, further comprising a beam steering controller (BSC) electronically connected to the AESA and operable to control beam-forming integrated circuits of each of the associated RF channels.

6. The test system of claim 5, wherein:

the test processor is configured to command the BSC to traverse of all permutations of the RF channels by incoherently driving the AESA through all amplitude and time-dependence states for each RF channels; and estimating FF patterns of the AESA comprises analytically extrapolating from individual element analyses received from the RF measurement device to the FF pattern using Hadamard orthonormal transformations.

7. The test system of claim 1, wherein the RF measurement device is a precision vector RF measurement device configured for RF evaluation of coherently connected two-port transmit and receive parameters including the amplitudes and the phases and/or time delays.

8. The test system of claim 1, wherein the test processor is configured to iteratively repeat the estimation of FF patterns and the calculation of FF FoMs, and to adjust calibrations of the AESA between these iterations in response to the FF FoMs falling outside of accepted ranges, such that the validation occurs once any adjustments to the calibrations produce FF FoMs within the accepted ranges.

9. The test system of claim 8, wherein the calculation of FF FoMs comprises:

estimating first FoMs characterizing borescope FF performance of the AESA;

evaluating whether the first FoMs fall within first acceptable ranges; and in response to the first FoMs falling within acceptable ranges, evaluating second FoMs characterizing the AESA over frequency and scan volume.

10. The test system of claim 9, wherein the calculation of FF FoMs further comprises:

evaluating whether the second FoMs fall within second acceptable ranges; and in response to the second FoMs falling within acceptable ranges, evaluating third FoMs characterizing the AESA over environmentals including humidity, pressure, and temperature; and evaluating whether the third FoMs fall within third acceptable ranges.

11. The test system of claim 10, wherein the test processor is configured to adjust element-level gains and/or phases of the RF channels in response to the first, second, or third FoMs falling outside of respective first, second, and third acceptable ranges.

12. The test system of claim 2, wherein the anechoic enclosure includes tools configured to control and sense multiple environmental parameters from among temperature, pressure, and humidity, within the anechoic isolating enclosure.

13. A method of testing an AESA, the method comprising:

mounting the AESA and a test probe in a fixed geometric relationship, the AESA comprising a plurality of individual antenna elements with respective radiofrequency (RF) channels;

surrounding the AESA and the test probe in an anechoic enclosure;

collecting RF amplitudes and phases and/or time delays of the test probe and the AESA using a precision network analyzer (PNA);

predicting free space path losses and propagation delays between the AESA and the test probe based on the fixed geometric relationship;

estimating far field (FF) patterns of the AESA based on post-processing of the collected RF amplitudes and phases and/or time delays, and based on the predicted free space path losses and propagation delays;

calculating FF figures of merit (FoMs) for the AESA over frequency, beam scan, and environmentals based on the estimated FF patterns of the AESA.

14. The method of claim 13, further comprising evaluating the FF FoMs against acceptable ranges, and recalibrating the RF channels of the individual antenna elements of the AESA in response to the FF FoMs falling outside of the acceptable ranges.

15. The method of claim 14, wherein evaluating the FF FoMs comprises successively testing FF FoMs over frequency, then over frequency and beam scan, then over frequency, beam scan, and environmentals.

16. The method of claim 13, further comprising controlling at least one of humidity, temperature, and pressure within the enclosure, wherein calculating FF FoMs over environmentals comprises evaluating AESA performance at environmental conditions within the enclosure at selected values of humidity, temperature, and/or pressure.

17. The method of claim 13, wherein estimating FF patterns of the AESA comprises extrapolating from disentangled characterizations of the individual RF elements to an overall FF pattern based on orthonormal transformations.

* * * * *